(12) United States Patent
Newsome et al.

(10) Patent No.: US 7,501,308 B2
(45) Date of Patent: Mar. 10, 2009

(54) METHOD OF DEPOSITING POLYTHIOPHENE SEMICONDUCTOR ON A SUBSTRATE

(75) Inventors: Christopher Newsome, Cambridge (GB); Shunpu Li, Cambridge (GB); Thomas Kugler, Cambridge (GB); David Russell, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 90 days.

(21) Appl. No.: 11/336,778

(22) Filed: Jan. 23, 2006

(65) Prior Publication Data

US 2006/0223219 A1  Oct. 5, 2006

(30) Foreign Application Priority Data

Apr. 1, 2005  (GB)  ................... 05 067 01

(51) Int. Cl.
*H01L 51/40* (2006.01)
(52) U.S. Cl. ......................... 438/99; 438/149
(58) Field of Classification Search .................. 438/99, 438/149
See application file for complete search history.

(56) References Cited

U.S. PATENT DOCUMENTS

| 5,139,878 | A * | 8/1992 | Kim et al. ................... 428/421 |
| 6,916,902 | B2 * | 7/2005 | Inbasekaran et al. ........ 528/397 |
| 7,048,874 | B2 * | 5/2006 | Louwet et al. .............. 252/500 |
| 7,262,264 | B2 * | 8/2007 | Werner et al. ............... 528/377 |
| 2002/0180372 | A1 | 12/2002 | Yamazaki |
| 2003/0059975 | A1 * | 3/2003 | Sirringhaus et al. ........... 438/99 |
| 2003/0136958 | A1 * | 7/2003 | Ong et al. ....................... 257/40 |
| 2003/0139505 | A1 | 7/2003 | Reuter et al. |
| 2004/0056180 | A1 * | 3/2004 | Yu .......................... 250/214.1 |
| 2004/0075124 | A1 | 4/2004 | Wu et al. |
| 2004/0183068 | A1 * | 9/2004 | Ong et al. ....................... 257/40 |
| 2004/0206939 | A1 | 10/2004 | Spreitzer et al. |
| 2004/0214040 | A1 * | 10/2004 | Lee et al. ..................... 428/690 |
| 2004/0235227 | A1 * | 11/2004 | Kawase ....................... 438/158 |
| 2004/0236070 | A1 | 11/2004 | Ong et al. |
| 2005/0040394 | A1 * | 2/2005 | Wu et al. ....................... 257/40 |
| 2005/0250244 | A1 * | 11/2005 | Li et al. ......................... 438/99 |
| 2005/0274954 | A1 * | 12/2005 | Tanaka et al. ................. 257/72 |
| 2006/0076554 | A1 * | 4/2006 | Maeda et al. ................. 257/40 |
| 2006/0094153 | A1 * | 5/2006 | Furukawa ..................... 438/99 |
| 2007/0045614 | A1 * | 3/2007 | Sugaware et al. ............. 257/40 |
| 2007/0120112 | A1 * | 5/2007 | Morita et al. .................. 257/40 |

FOREIGN PATENT DOCUMENTS

EP  1 134 269 A2  9/2001
WO  WO 02/072714 A1  9/2002

OTHER PUBLICATIONS

Arici et al.; "Nanocrystalline CIS/Conjugated Polymer based Hybrid Solar Cells"; Proceedings of the 14th Workshop on Quantum Solar Energy Conversion—QUANTSOL 2002.

* cited by examiner

*Primary Examiner*—N. Drew Richards
*Assistant Examiner*—Grant S Withers
(74) *Attorney, Agent, or Firm*—Oliff & Berridge, PLC

(57) ABSTRACT

Provided is a method of depositing a polythiophene semiconductor on a substrate. First, the semiconductor is dissolved in a solvent comprising a halogen-containing aromatic compound. Then, the resulting solution is ink-jet printed onto the substrate. The method is useful in the production of microelectronic components such as thin film transistor devices.

6 Claims, 2 Drawing Sheets

METHOD OF DEPOSITING POLYTHIOPHENE SEMICONDUCTOR ON A SUBSTRATE

FIELD OF INVENTION

The present invention relates to a method of depositing polythiophene semiconductor on a substrate. The method is useful in the production of thin-film transistor (TFT) devices.

TECHNICAL BACKGROUND

Semiconductor materials have many applications in modern technology. In particular, semiconductor materials are useful in the production of microelectronic components such as transistors and diodes. Whilst inorganic semiconductors such as elemental silicon have traditionally been employed in the production of these microelectronic semiconductor components, recently other materials having semiconducting properties have become available and are being increasingly adopted by the microelectronic industry.

One such class of semiconductor materials is that of organic semiconductor materials. These materials are associated with a number of advantages over traditional silicon semiconductors. One such advantage is that organic semiconductor materials can be processed in simpler, less expensive ways. For instance, organic semiconductor materials can be dissolved in certain organic solvents enabling controlled deposition of the semiconductor in the manufacture of microelectronic components. This is advantageous because solution processing is relatively cheap so that a significant saving can be made as compared to the production facilities required to process for example a silicon semiconductor which requires high capital investment in complex vacuum deposition equipment.

Whilst the above-mentioned considerations of how a semiconductor can be processed are important in choosing a semiconductor material from which to produce microelectronic components, a critical characteristic of a semiconductor material is its electronic properties which allow the device to function. Two of the most important characteristics of a semiconductor material which determine its applicability in the production of microelectronic devices are its bulk conductivity and field effect mobility. When a semiconductor is incorporated into a transistor, the bulk conductivity of the semiconductor material determines the conductivity through the semiconductor when the transistor is off (the "off" state). Meanwhile, the field effect mobility determines the conductivity through the semiconductor when a voltage is applied through the gate electrode of the transistor (the "on" state). In terms of the electrical properties of a semiconductor, it is important for proper functioning of a microelectronic device produced using the semiconductor that the on/off ratio (that is, the ratio of the conductivity of the "on" state to the "off" state) is high.

One class of organic semiconductors which fulfils the criteria for applicability in microelectronic components, in particular that of having a high on/off ratio, is the class of polythiophenes. Polythiophenes generally exhibit low bulk conductivities and high field effect mobilities making these materials good candidates for the production of microelectronic components and in particular for the production of thin-film transistors (TFTs).

As explained above, it is highly desirable when processing organic semiconductors to make use of solution processing in which the semiconductor is dissolved in a solvent which is then deposited to produce areas or an extensive layer of the semiconductor. One particularly promising technique for depositing such solutions of semiconductors is ink-jet printing. This is because ink-jet printing conveniently allows relatively precise deposition of liquids onto a substrate in an automated manner. It would be highly desirable to be able to produce microelectronic semiconductor components such as for example TFTs by ink-jet printing a solution of polythiophene onto a suitable substrate.

However, a number of problems are encountered when trying to put this into practice. The key problem is that whilst it is possible to dissolve polythiophenes in solvents commonly used in organic semiconductor processing (e.g. toluene and xylene), the resulting solutions are not ideal for use in ink-jet printing. In order to be able to ink-jet print a solution, it is important that the solution maintains a constant viscosity over time. This is because if the solution does not have a constant and appropriate viscosity, the ink-jet printer cannot maintain the required droplet volume and ejection velocity over time. In addition to this, it is important that a solution to be printed does not contain particulate material above a certain size as such material tends to clog the nozzles of the ink-jet printer. It is also important that the solvent has an appropriate boiling point so that it will quickly evaporate after printing. This is particularly important if multiple overlying layers are to be printed.

In view of these requirements, solutions of polythiophene-based semidonductors in toluene and xylene have not been found to be suitable for ink-jet printing. Although polythiophenes are initially quite soluble in these solvents, there is a strong tendency for gels to form in the solution or for solid material to be precipitated therefrom after just a few days of storage. It is believed that this aggregation of polymer material in the solvent occurs due to interaction between the polythiophene chains. This tendency for the polythiophene chains to interact has been studied in the past because it is this property which results in polythiophenes having semiconducting properties. It is this interaction between adjacent chains which allows charge carriers to travel not only along the delocalised π-electrons along the polymer backbone but also to "jump" from chain to chain particularly when the chains are held close to each other due to strong inter-chain interaction.

For these reasons, there is at present no commercially viable way of ink-jet depositing a polythiophene semiconductor solution on a substrate.

In view of the various deficiencies of known methods of processing polythiophene semiconductor materials, there has been a need for the development of a new method of depositing polythiophene on a substrate. Accordingly, the present inventors set out to develop a new method of doing this which avoids the problems discussed above.

BRIEF DESCRIPTION OF THE INVENTION

The present invention provides in a first aspect a method of depositing a polythiophene semiconductor on a substrate comprising the steps of:

(i) dissolving the semiconductor in a solvent comprising a halogen-containing aromatic compound; and
  (ii) ink-jet printing the resulting solution onto the substrate.

Preferably, the polythiophene semiconductor has the formula:

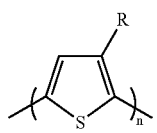

wherein R is a $C_{4-10}$ alkyl group and n represents an integer of 5-3,000.

Most preferably, the polythiophene semiconductor is P3HT:

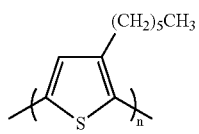

wherein n represents an integer of 5-3,000.

P3HT has particularly good electronic properties and has been found to be relatively easy to work with in the context of solution processing.

Preferably, the halogen-containing aromatic solvent comprises an aromatic ring to which one or more halogen atoms, preferably one, are directly bound.

Preferably, the halogen atom is chlorine or bromine.

The aromatic ring is preferably thiophene or a homoaromatic ring such as a benzene ring.

The present prevention provides in a second aspect a method of producing a thin-film transistor device comprising the step of:
(i) depositing a polythiophene semiconductor on a substrate as defined above, wherein the substrate includes pre-formed source and drain electrodes.

Preferably, this method further comprises the steps of:
(ii) depositing an insulator layer onto the deposited polythiophene;
(iii) depositing a gate electrode onto the insulator layer in appropriate alignment with the pre-formed source and drain electrodes.

The method of the present invention concerns ink-jet printing a solution of a polythiophene semiconductor in a solvent comprising a halogen-containing aromatic compound onto a substrate. In the following paragraphs, the nature of the polythiophene, the solvent and resulting solution, the substrate, the ink-jet printing process and the application of this method in the production of TFTs are discussed with reference to the accompanying drawings in which.

DETAILED DESCRIPTION OF THE INVENTION

The Polythiophene

Figure 1A:
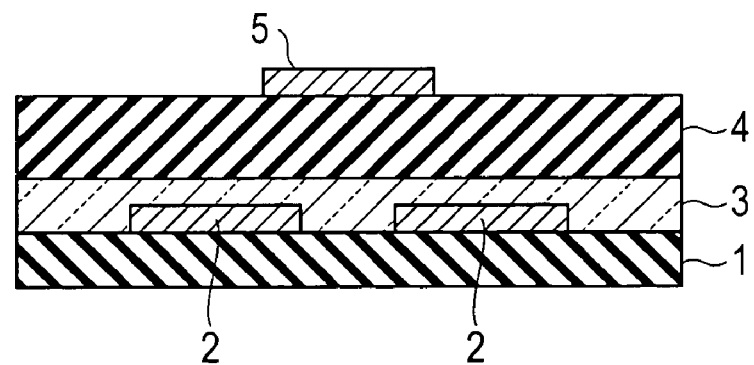
FIG. 1 shows in part (a) a schematic cross-section through a thin-film transistor and in part (b) a schematic cross-section through a light emitting diode.

The polythiophene semiconductor used in the method of the present invention can in principle be any polythiophene semiconductor. Preferably, a polythiophene of the generic formula set out above is used because these materials have particularly favourable electronic properties as well as favourable physical properties which render them suitable for solution processing. In the generic formula, the index n represents the average number of thiophene monomer units present in the polythiophene semiconductor, i.e. the chain length of the polythiophene. Because even polythiophene oligomers have semiconducting properties, the value of n can be as low as 5. Also much longer polymer chains where the value of n is up to 3,000 can be used, although as the polymer chain length increases, the solubility of the polymer decreases and thus becomes less suitable for solution processing by ink-jet printing. Accordingly, it is preferable that the index n has a value of less than 1,500, more preferably less than 800 and most preferably less than 500. Whilst it is possible to use polythiophene materials having very low n values as discussed above, it is preferable that n has a value of at least 100 because polythiophene materials with at least this chain length tend to have better electronic properties. More preferably, n is greater than 200 and most preferably greater than 300. The most preferable range of the n value is 300-500.

Most preferably, the polythiophene semiconductor is P3HT which is a commercially available organic semiconductor known to have highly favourable electronic properties.

The Solvent and Solution

Turning now to the solvent used in the method of the present invention, the present inventors have surprisingly found a class of solvents which can be used to dissolve a polythiophene semiconductor in a manner whereby the problems associated with dissolving such materials in for example toluene or xylene, and in particular the problem of rapid gel-formation, can be avoided. The present inventors have found that where a solvent is used which comprises a halogen-containing aromatic compound, it is possible not only to adequately dissolve the polythiophene but also to maintain a solution having a substantially constant viscosity over a longer period of time than is possible when using toluene or xylene as the solvent, that is for at least 10 days and in some cases for several weeks.

Whilst any solvent comprising a halogen-containing aromatic compound can in principle be used in the method of the present invention, the halogen-containing aromatic solvent component preferably comprises an aromatic ring to which one or more halogen atoms (preferably one halogen atom) are directly bound. Preferably, the halogen atom is chlorine or bromine although any other halogen atom such as fluorine, iodine or astatine could in principle be used. The aromatic ring in the halogen-containing aromatic solvent component is preferably either thiophene or a homoaromatic ring such as benzene.

Preferable compounds which are comprised in the solvent used in the method of the present invention include compounds simultaneously comprising a benzene ring and a halogen atom. Examples of such compounds are set out in Table A below. Preferably, the halogen atom is bromine or chlorine, and this halogen atom is preferably bound directly to the benzene ring. Preferably examples of such compounds are compounds (a)-(f) set out in Table A below. Compounds (a), (b) and (c) are especially preferred.

Also preferable as the halogen-containing aromatic compound are compounds derived from a thiophene ring having one or more chlorine and/or bromine atoms bound directly thereto such as those set out in Table B below. Particularly preferable thiophene-based compounds are compounds (a), (b) and (c) as set out in Table B below.

Other than the requirement that the solvent must comprise a halogen-containing aromatic compound, there are no other specific requirements it must meet. Preferably, the halogen-containing aromatic compound is contained in the solvent in an amount of at least 80 wt. %, at least 90 wt. % or 100 wt. % in order of increasing preference. Thus, it is most preferable the solvent consists of halogen-containing aromatic compounds and that substantially no other co-solvent is present. On the other hand, a co-solvent might be used provided that this does not have a detrimental effect on the stability of the resulting semiconductor solution. For example, other halogenated solvents could be used as co-solvents.

Furthermore, it is preferable for the solvent to have a boiling point in the range of 140-260° C., more preferably 160-240° C., most preferably 170-230° C. This however is purely for convenience and is not an absolute requirement. In general, if a solvent with too low a boiling point is used, it will tend to evaporate quickly and may cause clogging of the ink-jet nozzle. Conversely, if the boiling point of the solvent is too high, it will take a long time for the ink-jet printed solution to dry which is also generally not favourable.

In terms of the solvent used, it is furthermore preferable that the selected solvent is available on a commercial scale at a low price. Again, this is not an absolute requirement to carry out the method of the present invention but is preferred in commercial practice.

Turning now to the preparation of the semiconductor solution, generally the semiconductor is present in an amount of 5-30 mg, preferably 10-20 mg per ml of solvent. The solution is prepared by adding the appropriate amount of solid semiconductor to the solvent, and then heating the resulting mixture until the semiconductor is completely dissolved in the solvent. This can for example be achieved by heating the mixture of the solvent and the semiconductor at 40-90° C., preferably 50-80° C., for 10-40 minutes, preferably 20-30 minutes. Generally, agitation of the mixture during dissolution for example by stirring helps to speed up the dissolution process. Once the semiconductor is completely dissolved in the solvent, the resulting solution should be left to cool to room temperature and then filtered to remove any solid contaminants which may be present. This can for example be brought about by filtering through a 0.45 micron sized pore filter.

It is preferable that the solution of the polythiophene semiconductor has a viscosity of 2-30 cP, more preferably 5-20 cP and most preferably a viscosity in the range 5-12 cP. Whilst this is not an essential feature of the present invention, it is nevertheless important to control the viscosity of a solution to be ink-jet printed because, as discussed above, the viscosity of the ink has an impact on droplet size and printing accuracy.

The Substrate

In terms of the substrate onto which the polythiophene semiconductor is ink-jet printed, there are no particular limitations. If the method is being used to produce for example a sheet of transistors, then a flexible substrate, for example a flexible polymer substrate such as polymethylmethacrylate, might be used. Alternatively, the method could be used to deposit semiconductor material onto a rigid plate such as for example a glass plate or an indium tin oxide plate. The substrate may include pre-formed electronic structures.

Ink-Jet Printing Process

In terms of the ink-jet printer used, this is not of critical importance. For example an industrial ink-jet printer comprising a piezoelectric driven head could be used.

After ink-jet printing of the solution onto the substrate, the solvent evaporates away leaving behind the deposited semiconductor material. Where drying is carried out at room temperature, this can take several minutes for some organic solvents; this is typically the case where the boiling point of the solvent is above 200° C. Heating the printed substrate will help to remove the solvent at a faster rate. The present inventors have found it to be effective to heat the printed substrate to 80° C. for 1 hour, preferably in an inert atmosphere, after printing although whether or not heating is required and the exact requirements of the heating step depends on the nature of the semiconductor, substrate and solvent.

Generally, the printing of the semiconductor layer is carried out so as to obtain a film thickness of deposited semiconductor in the range 10-100 nm. Preferably, the thickness of the deposited film is 20-50 nm.

Application in Producing TFTs

Figure 1B:
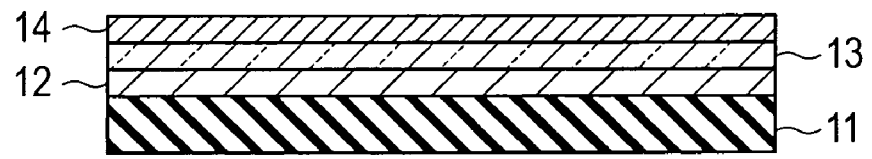

The method of the present invention has particularly useful applications in the context of the production of microelectronic devices, and in particular in the production of thin-film transistor devices (TFTs) and light-emitting diodes by ink-jet printing. Such devices are well-known to workers in the field of microelectronic devices, and are schematically illustrated in FIG. 1, where part (a) shows a TFT in cross-section whilst part (b) shows an LED in cross-section.

The TFT illustrated in part (a) comprises a substrate (1), source and drain electrodes (2), a semiconductor layer (3), an insulating layer (4) and a gate electrode (5).

The LED in part (b) comprises a substrate (11) which is patterned with an anode, a charge injection layer (12), an emissive semiconductor layer (13) and a cathode (14).

Figure 2:
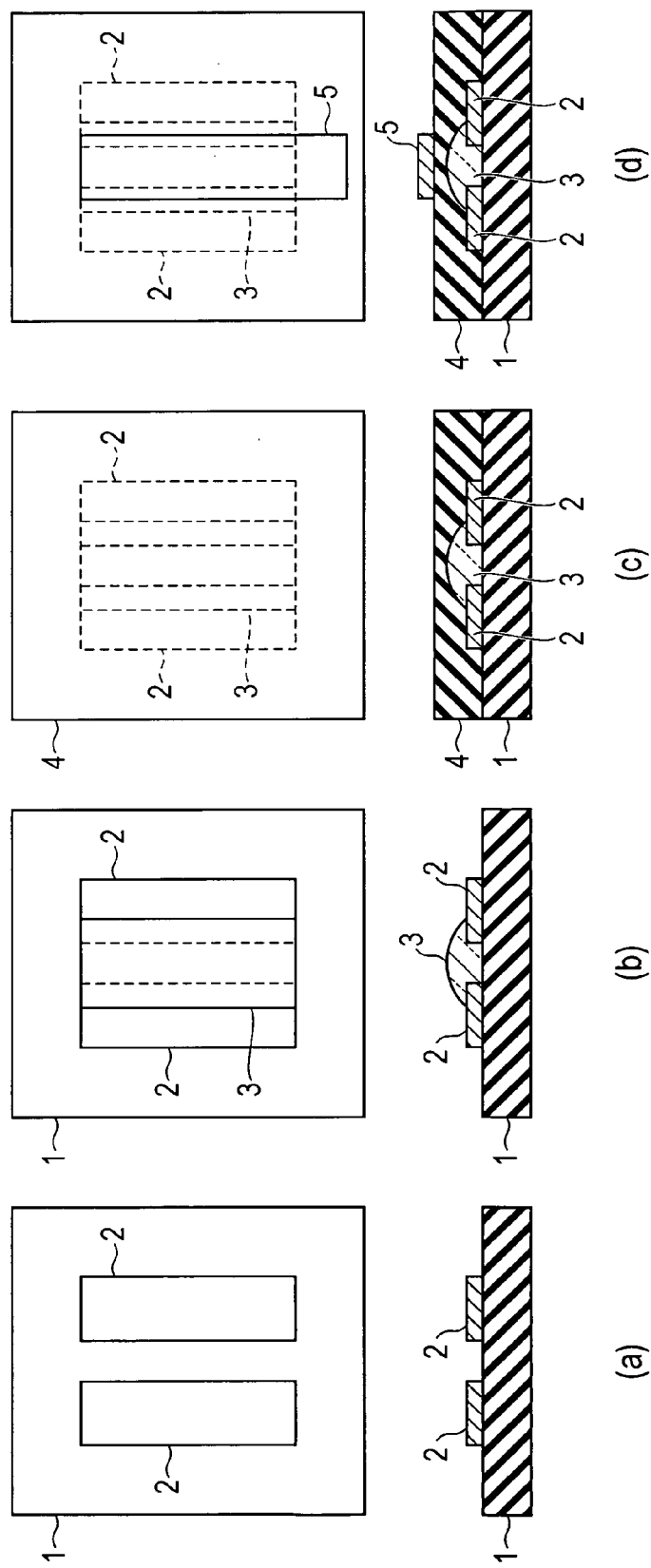
FIG. 2 shows a step-by-step process for fabricating a TFT device including the deposition method provided by the present invention, both as seen from above and in cross-section.

A TFT device can be made using the deposition method of the present invention. A method of preparing a TFT using the deposition method of the present invention is schematically illustrated in FIG. 2 which shows a step-by-step process for fabricating a TFT device. In part (a), a substrate (1) comprising pre-patterned source and drain electrodes (2) is shown. The deposition method of the present invention is applied to this substrate by ink-jet printing a solution of a polythiophene semiconductor (3) in a solvent comprising a halogen-containing aromatic compound so that the ink-jet printed material contacts both source and drain electrodes (2) and forms a semiconductor bridge between these components in a manner known to a person skilled in the art. This is shown in part (b). Subsequently, an insulating layer (4) is deposited onto the electrodes (2) and semiconductor (3) as shown in part (c) of FIG. 2. Finally, a gate electrode (5) is deposited in alignment with the underlying source and drain electrodes. The result as shown in part (d) of FIG. 2 is a fully formed thin-film transistor.

EXAMPLES

The present invention will now be described by means of specific examples.

Example 1

10 mg of P3HT (Sigma Aldrich) was mixed with one ml of bromobenzene (compound (a) in Table A below) in a capped glass vial. The P3HT was dissolved in the bromobenzene by heating the mixture at 80° C. for 30 minutes. At the end of this period, all of the P3HT was dissolved. The solution was then cooled to room temperature and transferred to a polypropylene syringe and was filtered using a 0.45 micron pore filter (Acrodisk) attached to the syringe. The filtrate was collected in a capped glass vial, and was maintained at room temperature for a period of three weeks during which time the solution was periodically monitored to see whether or not gel formation or precipitation of solid was observed.

The solution was found to be stable for several weeks before gel formation was observed.

Example 2

The method of Example 1 was repeated using chlorobenzene (compound (b) in Table A below) instead of bromobenzene.

The resulting solution was found to be stable for several weeks before gel formation was observed.

Example 3

The method of Example 1 was repeated using 1,2,4-trichlorobenzene (compound (c) in Table A below) instead of bromobenzene.

The resulting solution was found to be stable for several weeks before gel formation was observed.

Example 4

The method of Example 1 was repeated using 1,3-dichlorobenzene (compound (d) in Table A below) instead of bromobenzene.

This solution was found to be stable for more than 10 days before gel formation was observed.

Example 5

The method of Example 1 was repeated using 1,3-dibromobenzene (compound (e) in Table A below) instead of bromobenzene.

This solution was found to be stable for more than 10 days before gel formation was observed.

Example 6

The method of Example 1 was repeated using 2,4-dichlorotoluene (compound (f) in Table A below) instead of bromobenzene.

This solution was found to be stable for more than 10 days before gel formation was observed.

Compounds (g)-(v) in Table A below were not tested, but by extrapolation it can be inferred that the same technical effect as observed in Examples 1-6 above would equally be seen for these and other halogen-containing aromatic solvents.

Example 7

The method of Example 1 was repeated using 2-bromothiophene (compound (a) in Table B below) instead of bromobenzene.

This solution was found to be stable for more than 10 days before gel formation was observed.

Example 8

The method of Example 1 was repeated using 2-chlorothiophene (compound (b) in Table B below) instead of bromobenzene.

This solution was found to be stable for more than 10 days before gel formation was observed.

Example 9

The method of Example 1 was repeated using 2,5-dibromothiophene (compound (c) in Table B below) instead of bromobenzene.

This solution was found to be stable for more than 10 days before gel formation was observed.

Compounds (d) and (e) of Table B were not tested but by extrapolation it can be inferred that the same technical effect as observed in Examples 7-9 above would equally be seen for these and other halogen-containing aromatic solvents.

Comparative Example 1

The method of Example 1 above was reproduced except using toluene instead of bromobenzene as the solvent.

Gel formation was observed within 2 days of preparation of the solution.

Comparative Example 2

The method of Example 1 was reproduced using xylene instead of bromobenzene as the solvent.

Gel formation was observed within 2 days of preparing the solution.

TABLE A

| | Solvent Compound | Time before gel formation or precipitation occurs in a 10 mg/ml solution of P3HT in the solvent |
|---|---|---|
| (a) | 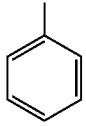 | Several Weeks |
| (b) | 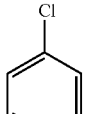 | Several Weeks |
| (c) | 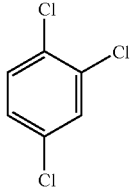 | Several Weeks |
| (d) | 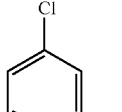 | More than 10 Days |
| (e) | 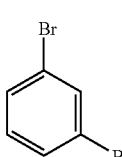 | More than 10 Days |

Benzene based solvents

TABLE A-continued
Benzene based solvents
| Solvent Compound | | Time before gel formation or precipitation occurs in a 10 mg/ml solution of P3HT in the solvent |
|---|---|---|
| (f) | 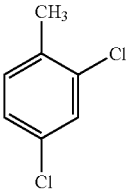 | More than 10 Days |
| (g) | 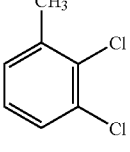 | — |
| (h) | 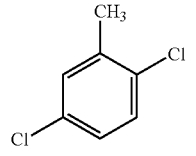 | — |
| (i) | 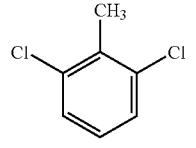 | — |
| (j) | 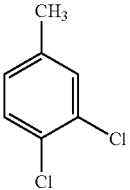 | — |
| (k) | 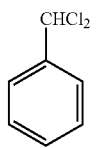 | — |
| (l) | 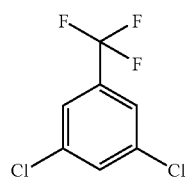 | — |
| (m) | 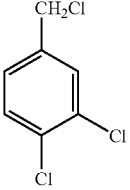 | — |
| (n) | 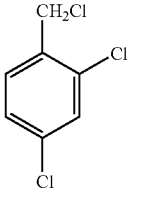 | — |
| (o) | 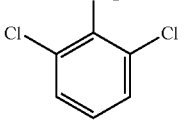 | — |
| (p) | 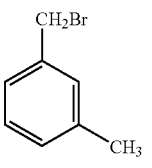 | — |
| (q) | 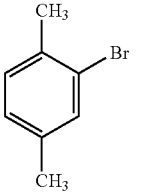 | — |
| (r) | 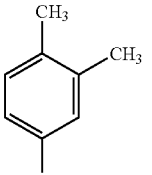 | — |
| (s) | 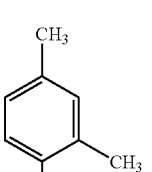 | — |
| (t) | 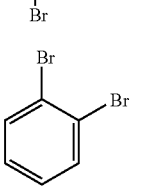 | — |
| (u) | 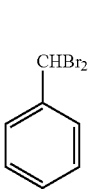 | — |

TABLE A-continued

Benzene based solvents

| Solvent Compound | Time before gel formation or precipitation occurs in a 10 mg/ml solution of P3HT in the solvent |
|---|---|
| (v) ![3,4-dibromotoluene] | — |

TABLE B

Thiophene Based Solvents

| Solvent Compound | Time before gel formation or precipitation occurs in a 10 mg/ml solution of P3HT in the solvent |
|---|---|
| (a) 2-bromothiophene | More than 10 Days |
| (b) 2-chlorothiophene | More than 10 Days |
| (c) 2,5-dibromothiophene | More than 10 Days |
| (d) 2,3-dibromothiophene | — |
| (e) 2,4-dibromothiophene | — |

The invention claimed is:

1. A method of depositing a polythiophene semiconductor on a substrate, the method comprising:

dissolving the polythiophene semiconductor in a solvent to form a solution, the solvent including a thiophene compound having a halogen atom bound directly to the thiophene ring; and ink-jet printing the resulting solution onto the substrate.

2. A method according to claim 1, wherein the polythiophene semiconductor has the formula:

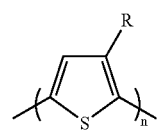

wherein R is a $C_{4-10}$ alkyl group and n represents an integer of 5-3,000.

3. A method according to claim 2, wherein the polythiophene semiconductor is P3HT:

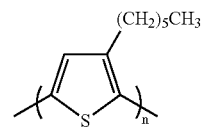

wherein n represents an integer of 5-3,000.

4. A method according to claim 1, wherein the halogen atom is chlorine or bromine.

5. A method of producing a thin-film transistor device which comprises depositing a polythiophene semiconductor on a substrate according to the method defined in claim 1, wherein the substrate includes pre-formed source and drain electrodes.

6. A method according to claim 5, further comprising:

depositing an insulator layer onto the deposited polythiophene; and depositing a gate electrode onto the insulator layer in appropriate alignment with the pre-formed source and drain electrodes.

* * * * *